US011133366B2

(12) United States Patent
Gu

(10) Patent No.: US 11,133,366 B2
(45) Date of Patent: Sep. 28, 2021

(54) ARRAY SUBSTRATE AND METHOD OF MANUFACTURING THE SAME, AND DISPLAY DEVICE

(71) Applicant: BOE TECHNOLOGY GROUP CO., LTD., Beijing (CN)

(72) Inventor: Pengfei Gu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/607,937

(22) PCT Filed: Oct. 24, 2018

(86) PCT No.: PCT/CN2018/111710
§ 371 (c)(1),
(2) Date: Oct. 24, 2019

(87) PCT Pub. No.: WO2019/109748
PCT Pub. Date: Jun. 13, 2019

(65) Prior Publication Data
US 2020/0411624 A1 Dec. 31, 2020

(30) Foreign Application Priority Data
Dec. 4, 2017 (CN) .......................... 201711266313.1

(51) Int. Cl.
*H01L 27/00* (2006.01)
*H01L 29/00* (2006.01)
(Continued)

(52) U.S. Cl.
CPC ...... *H01L 27/3272* (2013.01); *H01L 29/7869* (2013.01); *H01L 29/78603* (2013.01); *H01L 2227/323* (2013.01)

(58) Field of Classification Search
CPC ............... H01L 27/3272; H01L 27/124; H01L 27/3262; H01L 27/127; H01L 27/3248;
(Continued)

(56) References Cited

U.S. PATENT DOCUMENTS 6,812,912 B2 * 11/2004 Miyajima ......... G02F 1/136213
257/59
8,530,912 B2 * 9/2013 Cheng ............... G02F 1/136213
257/89

(Continued)

FOREIGN PATENT DOCUMENTS

CN 102315278 A 1/2012
CN 102955312 A 3/2013
(Continued)

OTHER PUBLICATIONS

International Search Report and Written Opinion issued in corresponding International Application No. PCT/CN2018/111710, dated Dec. 19, 2018, with English translation.
(Continued)

*Primary Examiner* — Nikolay K Yushin
(74) *Attorney, Agent, or Firm* — McDermott Will and Emery LLP

(57) ABSTRACT

An array substrate includes a base substrate, a first buffer layer, an oxygen barrier pattern, and a second buffer layer that are disposed on the base substrate in sequence, and a plurality of first thin film transistors (TFTs) that are disposed on the second buffer layer. The oxygen barrier pattern includes a plurality of oxygen barrier portions that are insulated and spaced apart. An orthographic projection of a portion of an active layer of one first TFT between a source and a drain on the base substrate is located within a range of an orthographic projection of one corresponding oxygen barrier portion of the plurality of oxygen barrier portions on the base substrate. And an oxygen content of the first buffer
(Continued)

layer is higher than an oxygen content of the second buffer layer.

17 Claims, 4 Drawing Sheets

(51) Int. Cl.
    *H01L 27/32*     (2006.01)
    *H01L 29/786*     (2006.01)

(58) Field of Classification Search
    CPC ........... H01L 29/78603; H01L 29/7869; H01L 29/78633; H01L 29/41733; H01L 29/78696; H01L 2227/323; H01L 27/1218; H01L 27/1225; H01L 27/1262; H01L 29/66757; H01L 29/78618
    See application file for complete search history.

(56) References Cited

U.S. PATENT DOCUMENTS

| | | | | |
|---|---|---|---|---|
| 9,530,830 | B2* | 12/2016 | Ryu | H01L 51/5253 |
| 9,934,723 | B2* | 4/2018 | Lee | H01L 27/3279 |
| 2002/0171086 | A1* | 11/2002 | Miyajima | G02F 1/136213 |
| | | | | 257/72 |
| 2011/0309397 | A1* | 12/2011 | Cheng | G02F 1/136227 |
| | | | | 257/98 |
| 2012/0007084 | A1 | 1/2012 | Park et al. | |
| 2014/0131715 | A1 | 5/2014 | Liu et al. | |
| 2015/0187878 | A1 | 7/2015 | Yamazaki et al. | |
| 2015/0228803 | A1 | 8/2015 | Koezuka et al. | |
| 2015/0379923 | A1* | 12/2015 | Lee | G09G 3/3233 |
| | | | | 345/206 |
| 2016/0005803 | A1* | 1/2016 | Ryu | H01L 27/3258 |
| | | | | 257/40 |
| 2016/0240598 | A1 | 8/2016 | You | |
| 2016/0322602 | A1 | 11/2016 | Jung et al. | |
| 2017/0194168 | A1 | 7/2017 | Yang et al. | |
| 2017/0307921 | A1 | 10/2017 | Feng | |
| 2019/0081077 | A1 | 3/2019 | Suzuki et al. | |

FOREIGN PATENT DOCUMENTS

| | | |
|---|---|---|
| CN | 105140298 A | 12/2015 |
| CN | 105280679 A | 1/2016 |
| CN | 105849913 A | 8/2016 |
| CN | 108039351 A | 5/2018 |
| WO | 2016/092427 A1 | 6/2016 |
| WO | 2017/0159613 A1 | 9/2017 |

OTHER PUBLICATIONS

First Office Action issued in corresponding Chinese Application No. 201711266313.1 dated Nov. 28, 2019, with English translation.
Examination Report issued in related Indian Patent Application No. 201927051375, dated Mar. 24, 2021; with English translation.
Extended European Search Repoer dated Jul. 30, 2021 issued in counterpart European Patent Application No. 1886758.4.

* cited by examiner

ARRAY SUBSTRATE AND METHOD OF MANUFACTURING THE SAME, AND DISPLAY DEVICE

CROSS-REFERENCE TO RELATED APPLICATION

This application is a national phase entry under 35 USC 371 of International Patent Application No. PCT/CN2018/111710 filed on Oct. 24, 2018, which claims priority to Chinese Patent Application No. 201711266313.1, filed with the Chinese Patent Office on Dec. 4, 2017, titled "ARRAY SUBSTRATE AND MANUFACTURING METHOD THEREOF, AND DISPLAY APPARATUS", which are incorporated herein by reference in their entirety.

TECHNICAL FIELD

The present disclosure relates to the field of display technologies, and in particular, to an array substrate and a method of manufacturing the same, and a display device.

BACKGROUND

With the development of display technology, thin-film-transistor liquid-crystal display (TFT-LCD) devices and organic light-emitting diode (OLED) display devices have seen rapid development.

SUMMARY

In a first aspect, an array substrate is provided. The array substrate includes a base substrate, a first buffer layer, an oxygen barrier pattern, and a second buffer layer that are disposed on the base substrate in sequence, and a plurality of first thin film transistors (TFTs) that are disposed on the second buffer layer. The oxygen barrier pattern includes a plurality of oxygen barrier portions that are insulated and spaced apart. An orthographic projection of a portion of an active layer of one first TFT between a source and a drain on the base substrate is located within a range of an orthographic projection of one corresponding oxygen barrier portion of the plurality of oxygen barrier portions on the base substrate. An oxygen content of the first buffer layer is higher than an oxygen content of the second buffer layer.

In some embodiments of the present disclosure, an orthographic projection of the active layer of one first TFT on the base substrate is located within the range of the orthographic projection of one corresponding oxygen barrier portion of the plurality of oxygen barrier portions on the base substrate.

In some embodiments of the present disclosure, a material of the oxygen barrier portion includes a conductive material. A source of the first TFT is coupled to the oxygen barrier portion.

In some embodiments of the present disclosure, one second TFT is a top-gate TFT. The array substrate further includes a light-shielding pattern located between the base substrate and the first buffer layer. The light-shielding pattern includes a plurality of light-shielding portions that are insulated and spaced apart. An orthographic projection of a portion of an active layer of one second TFT between a source and a drain on the base substrate is located within a range of an orthographic projection of one corresponding light-shielding portion of the plurality of light-shielding portions on the base substrate.

In some embodiments of the present disclosure, a material of the light-shielding portion includes a conductive material. A source of the second TFT is coupled to the light-shielding portion.

In some embodiments of the present disclosure, a material of the oxygen barrier portion includes a light-shielding material.

In some embodiments of the present disclosure, the oxygen barrier pattern includes at least two thin films that are disposed on top of one another.

In some embodiments of the present disclosure, the first TFTs are driving TFTs, and the second TFTs are switching TFTs.

In another aspect, a display device is provided. The display device includes any one of the array substrates described above.

In yet another aspect, a method of manufacturing an array substrate is provided. The method includes: forming a first buffer layer, an oxygen barrier pattern, and a second buffer layer on the base substrate in sequence, an oxygen content of the first buffer layer being higher than an oxygen content of the second buffer layer, and the oxygen barrier pattern including a plurality of oxygen barrier portions that are insulated and spaced apart; and forming a plurality of first TFTs at the base substrate on which the second buffer layer is formed, an orthographic projection of a portion of an active layer of one first TFT between a source and a drain on the base substrate being located within a range of an orthographic projection of one corresponding oxygen barrier portion of the plurality of oxygen barrier portions on the base substrate.

In some embodiments of the present disclosure, the step of forming a plurality of first TFTs and a plurality of second TFTs at the base substrate on which the second buffer layer is formed, includes: forming an oxide semiconductor layer on the second buffer layer, and forming patterns of a plurality of active layers by performing a patterning process on the oxide semiconductor layer; forming an insulating film and a metal film on the patterns of a plurality of active layers in sequence, and patterning the insulating film and the metal film by a same photolithography process, so as to form a plurality of gate insulating layers and a plurality of gates with each gate insulating layer and each gate having a same shape and size; forming an interlayer dielectric layer, and forming a plurality of through holes on the interlayer dielectric layer by a patterning process; and forming a source drain metal layer, and forming patterns of a plurality of sources and patterns of a plurality of drains by performing a patterning process on the source drain metal layer, one source of the plurality of sources and one drain of the plurality of drains being respectively coupled to one corresponding active layer through different through holes.

In some embodiments of the present disclosure, after forming the oxide semiconductor layer on the second buffer layer, the method further includes performing an annealing or heating process; and/or, after forming the gate insulating layers and the gates, the method further includes performing an annealing or heating process; and/or, after forming the first TFTs and the second TFTs, the method further includes performing an annealing or heating process.

In some embodiments of the present disclosure, the step of forming a plurality of first TFTs at the base substrate on which the second buffer layer is formed, includes forming a plurality of first TFTs and a plurality of second TFTs at the base substrate on which the second buffer layer is formed, wherein each first TFT is different from each second TFT.

In some embodiments of the present disclosure, the step of forming a first buffer layer and a second buffer layer, includes adjusting a content of an oxygen source so that the content of the oxygen source in a process of forming a first buffer layer is greater than that in a process of forming a second buffer layer.

In some embodiments of the present disclosure, the step of performing an annealing or heating process, includes performing an annealing or heating process on the first buffer layer.

In some embodiments of the present disclosure, the array substrate, further includes a plurality of second TFTs that are disposed on the second buffer layer.

In some embodiments of the present disclosure, an orthographic projection of a portion of an active layer of one second TFT between a source and a drain on the base substrate is located outside a range of an orthographic projection of any one of the plurality of oxygen barrier portions on the base substrate.

In some embodiments of the present disclosure, one first TFT is a top-gate TFT.

In some embodiments of the present disclosure, the array substrate further includes an interlayer dielectric layer located between sources of the plurality of first TFTs and the second buffer layer. A source of the first TFT is connected to the oxygen barrier portion through one through hole passed through the interlayer dielectric layer and the second buffer layer.

In some embodiments of the present disclosure, the array substrate further includes an interlayer dielectric layer located between sources of the plurality of second TFTs and the second buffer layer. A source of the second TFT is connected to the light-shielding portion through one through hole passed through the interlayer dielectric layer, the second buffer layer and the first buffer layer.

BRIEF DESCRIPTION OF THE DRAWINGS

In order to describe technical solutions in some embodiments of the present disclosure or in the prior art more clearly, the accompanying drawings to be used in the description of embodiments or in the prior art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

A driving circuit for driving sub-pixels for display is provided in a display panel of a display device. The driving circuit may be a gate driving circuit disposed in a non-display area of the display panel, or may be composed of pixel circuits disposed in a sub-pixel of the display panel. The driving circuit includes a plurality of thin film transistors (TFTs). Some TFTs of the plurality of TFTs have a load carrying function, and these TFTs may be referred to as driving TFTs; other TFTs function only as switches, and these TFTs are referred to as switching TFTs. A width-to-length ratio of a driving TFT is greater than a width-to-length ratio of a switching TFT.

Figure 1:
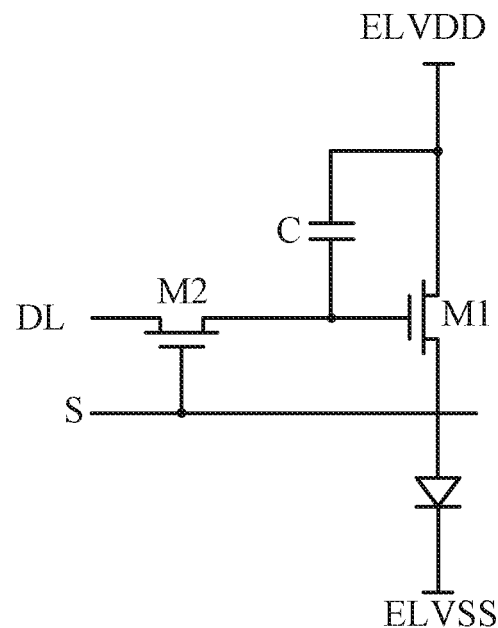
FIG. 1 is a schematic diagram showing a structure of a pixel circuit of an array substrate, in accordance with some embodiments of the present disclosure.

For example, in a case where the display panel is an organic light-emitting diode (OLED) display panel, the pixel circuit in the display panel is as shown in FIG. 1. The pixel circuit is a 2T1C circuit, and the 2T1C circuit includes two TFTs (e.g., M1 and M2) and one capacitor C.

An OLED device is a current device; current cannot be stored stably, but voltage can be temporarily stored in a capacitor. Therefore, a driving TFT (such as M1 in FIG. 1) is needed to convert a stored voltage into a current. Since M1 and the OLED device are coupled in series, a current flowing through M1 is a current flowing through the OLED device when the OLED device is operating. A voltage received by a gate of M1 is a data voltage Vdata, which is supplied from a data line DL. One end of the OLED device is coupled to the ELVDD (power supply voltage supplied to an electroluminescent device) terminal, and the other end is coupled to the ELVSS (common voltage supplied to an electroluminescent device) terminal.

In addition, in order to gate the sub-pixels row by row, the pixel circuit further includes a switching TFT (such as M2 in FIG. 1). in a case where an effective signal input through a signal line S turns on M2, a signal on the data line DL is input to a gate of M1.

As can be seen from the above, for a driving TFT and a switching TFT that are used for realizing different functions, since application requirements for the two kinds of TFTs in the display panel are different, the two kinds of TFTs also have different requirements for an external environment.

In order to obtain a better positive-bias temperature stress (PBTS), the driving TFT requires a low content of oxygen in a film layer that is in contact with the driving TFT, so as to ensure a stable display effect.

However, when the switching TFT is in an environment with a low content of oxygen, a negative bias illumination temperature stress (NBITS) of the switching TFT is poor, which easily causes serious negative bias and leads to the switching TFT being turned off abnormally. If an oxygen content in the environment is increased, the switching TFT may achieve better illumination stability, but the PBTS of the driving TFT may easily deteriorate. Therefore, it is difficult to adjust the oxygen content in the same film layer in contact with the different TFTs to adapt to different requirements of both the driving TFT and the switching TFT.

Figure 2:
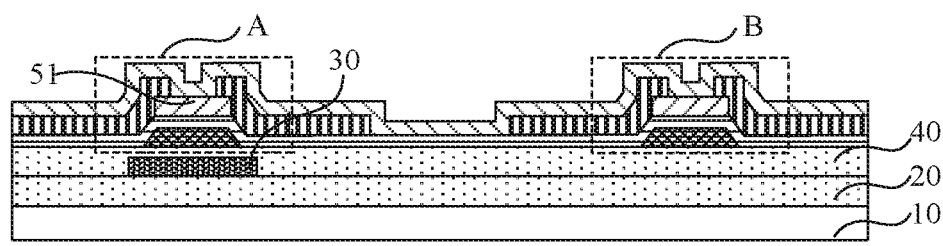
FIG. 2 is a schematic diagram showing a local structure of an array substrate, in accordance with some embodiments of the present disclosure.

Some embodiments of the present disclosure provide an array substrate. As shown in FIG. 2, the array substrate includes a base substrate 10.

It will be noted that, in some embodiments of the present disclosure, the base substrate 10 may be a glass substrate. In this case, the array substrate including the base substrate 10 described above is a display substrate that cannot be bent, or a display substrate that can only be bent to a small extent. Or, in some other embodiments of the present disclosure, the base substrate 10 may be a flexible substrate. In this case, the array substrate including the base substrate 10 described above may be a flexible display substrate that can be bent, or a flexible display substrate that can be bent to a large extent.

Figure 3:
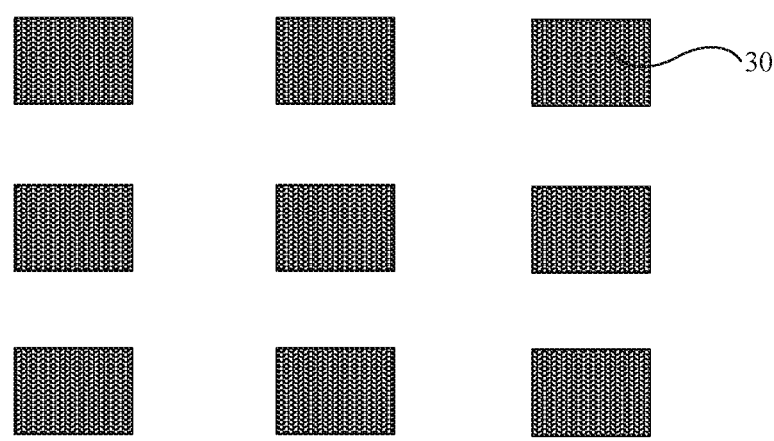
FIG. 3 is a schematic diagram showing a structure of an oxygen barrier pattern composed of a plurality of oxygen barrier portions in FIG. 2, in accordance with some embodiments of the present disclosure.

In addition, the array substrate further includes a first buffer layer 20, an oxygen barrier pattern 301 (as shown in FIG. 3) composed of a plurality of spaced-apart and insulated oxygen barrier portions 30, and a second buffer layer 40 that are disposed on the base substrate 10 in sequence, and a plurality of TFTs for realizing different functions disposed on the second buffer layer 40.

Since positions and functions of the plurality of TFTs in the array substrate are different, an oxygen content required to achieve better effect in the environment may also be different.

In some embodiments of the present disclosure, the plurality of transistors described above are divided into two categories, for example, driving TFTs and switching TFTs, according to different functions. As can be seen from the above, a driving TFT requires a low oxygen content in a film layer that is in contact with the driving TFT in order to obtain better PBTS; however, a switching TFT requires a high oxygen content in the environment, so as to achieve better illumination stability. Therefore, a driving TFT and a switching TFT require different oxygen contents in the environment.

For example, as shown in FIG. 2, the plurality of TFTs disposed on the second buffer layer 40 include first TFTs A and second TFTs B. A description is made below by taking an example in which the first TFTs A are driving TFTs and the second TFTs B are switching TFTs.

On this basis, an orthographic projection of a portion of an active layer 51 of a first TFT A between a source and a drain, that is, a channel region formed after the first TFT A is turned on, on the base substrate 10 is located within a range of an orthographic projection of one oxygen barrier portion 30 of the plurality of oxygen barrier portions 30 on the base substrate 10. In this case, the oxygen barrier portion 30 completely covers the channel region of the first TFT A.

An oxygen content of the first buffer layer 20 is higher than an oxygen content of the second buffer layer 40. In this case, oxygen atoms in the first buffer layer 20 will gradually diffuse into the second buffer layer 40, and further diffuse into active layers of the plurality of TFTs disposed on the second buffer layer 40.

Since an oxygen barrier portion 30 is disposed directly under the first TFT A, the oxygen barrier portion 30 may prevent oxygen atoms from diffusing into an active layer of the first TFT A. Thus, the oxygen atoms in the first buffer layer 20 may not be able to diffuse into a portion of the second buffer layer 40 corresponding to each of the first TFTs A, and may not be able to further diffuse into the first TFT A. Therefore, the first TFT A is in an environment having a low content of oxygen.

In addition, since an oxygen barrier portion 30 for blocking oxygen atoms is not disposed directly under the second TFTs B, the oxygen atoms in the first buffer layer 20 having a high content of oxygen may be able to further diffuse into an active layer of the second TFTs B. Therefore, the second TFTs B may obtain more oxygen atoms from the first buffer layer 20 and the second buffer layer 40, and the second TFTs B are in an environment having a high content of oxygen.

Since the oxygen content of the first buffer layer 20 is higher than the oxygen content of the second buffer layer 40, the first buffer layer 20 may supply more oxygen atoms to the active layers of the second TFTs B, thereby further increasing the oxygen content in the environment of the second TFTs B.

Some embodiments of the present disclosure are not limited to a case where the first TFTs A are driving TFT and the second TFTs B are switching TFTs, and are also applicable to other TFTs in the array substrate. In other examples, for TFTs that only have good electrical properties or good performance in a case where an oxygen content in an environment that is in contact with the TFTs is low, an oxygen barrier portion 30 may be disposed on a side of the TFT proximate to the base substrate 10 and at a position corresponding to a channel of the TFT, so as to use the oxygen barrier portion 30 to prevent oxygen atoms under the oxygen barrier portion 30 from diffusing into the active layer of the TFT.

As can be seen from the above, the array substrate provided by some embodiments of the present disclosure includes a base substrate 10, a first buffer layer 20, an oxygen barrier pattern composed of a plurality of oxygen barrier portions 30, and a second buffer layer 40 that are disposed on the base substrate 10 in sequence, and a plurality of TFTs disposed on the second buffer layer 40. The plurality of TFTs include first TFTs A and second TFTs B. In addition, an orthographic projection of a channel region of a first TFT A on the base substrate 10 is located within a range of an orthographic projection of one oxygen barrier portion 30 of the plurality of oxygen barrier portions 30 on the base substrate 10. In this case, an abundance of oxygen atoms in the first buffer layer 20 may diffuse into the second TFTs B through the second buffer layer 40, thereby improving the NBITS of the second TFTs B. In addition, an oxygen barrier portion 30 located under a first TFT A may block oxygen atoms in the first buffer layer 20 under the oxygen barrier portion 30. In a case where the oxygen content of the second buffer layer 40 is lower than the oxygen content of the first buffer layer 20, a first TFT A may only obtain a few oxygen atoms from the second buffer layer 40. Therefore, the PBTS of a first TFT A is ensured, and the purpose of providing different oxygen contents for different TFTs as needed to improve the performance of the TFTs is achieved.

In some embodiments of the present disclosure, in order to make the oxygen content of the first buffer layer 20 higher than the oxygen content of the second buffer layer 40, in a process of forming the first buffer layer 20 and the second buffer layer 40, a content of an oxygen source is adjusted so that a content of an oxygen source for forming the first buffer layer 20 is higher than a content of an oxygen source for forming the second buffer layer 40. For example, in a case where materials constituting the first buffer layer 20 and the second buffer layer 40 include silicon dioxide, the oxygen source may be nitrous oxide. In a process of forming the first buffer layer 20, a content of nitrous oxide is increased to increase the oxygen content of the first buffer layer 20.

Figure 4:
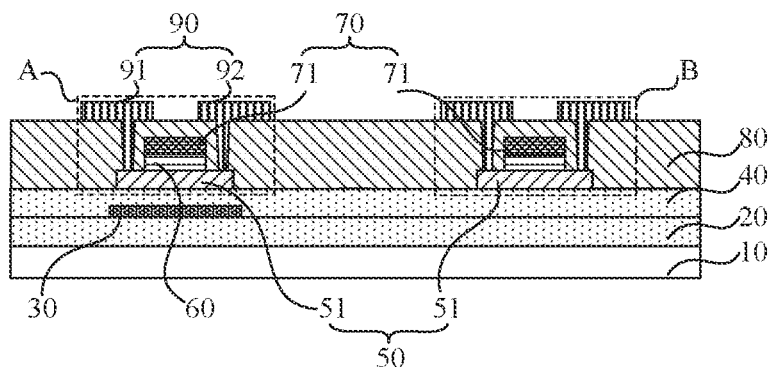
FIG. 4 is a schematic diagram showing a local structure of another array substrate, in accordance with some embodiments of the present disclosure.

In some embodiments of the present disclosure, according to a relative positional relationship between a gate and a gate insulating layer, the TFTs may be classified into two categories: top-gate TFTs and bottom-gate TFTs. As shown in FIG. 2, taking the base substrate 10 as a reference, a TFT in which the gate is disposed under the gate insulating layer is a bottom-gate TFT. As shown in FIG. 4, taking the base substrate 10 as a reference, a TFT in which the gate disposed on the gate insulating layer is a top-gate TFT.

Top-gate oxide TFTs have the advantages of being capable of reducing parasitic capacitance, meeting display requirements for high resolution, reducing a thickness of the gate insulating layer, and achieving relatively stable electrical properties of the TFTs.

Based on this, in some embodiments of the present disclosure, the first TFTs A and the second TFTs B are top-gate TFTs.

In this case, as shown in FIG. 4, the first TFTs A and the second TFTs B include an active layer 51, a gate insulating layer 60, a gate 71, and a portion of an interlayer insulating layer 80 corresponding to a corresponding TFT that are disposed on the second buffer layer 40 in sequence. In addition, the first TFT A further includes a source 91 and a drain 92.

A method of forming the first TFTs A and the second TFTs B includes the following processes. First, an oxide semiconductor layer 50 is formed on the second buffer layer 40, and a patterning process is performed on the oxide semiconductor layer 50 to form a plurality of active layers 51.

Next, a gate insulating layer 60 that is laid in a form of a whole layer and a gate metal layer 70 that is laid in a form of a whole layer are formed in sequence on the base substrate 10 on which the above structures are formed, and the gate insulating layer 60 and the gate metal layer 70 are patterned by a single patterning process to form a plurality of small gate insulating layers 60 and a plurality of gates 71. For example, taking a wet etching process as an example, by forming a specific pattern in a mask plate, and then performing masking, exposure, etching and other processes on the gate metal layer 70 laid in a form of a whole layer and the gate insulating layer 60 laid in a form of a whole layer using a shielding effect of the mask plate, patterns of the patterns of the gates 71 and patterns of the gate insulating layers 60 may be formed finally.

An orthographic projection of the gate insulating layer 60 on the base substrate 10 overlaps with an orthographic projection of the gate metal layer 70 on the base substrate 10. Moreover, a pattern of a gate 71 and a pattern of a corresponding gate insulating layer 60 are the same. In this way, a mask plate may be saved, and a single mask plate may be used to perform masking, and subsequent exposure, etching, and other processes on the gate metal layer 70 that is laid in a form of a whole layer and the gate insulating layer 60 that is laid in a form of a whole layer.

Next, an interlayer dielectric layer 80 and a source drain metal layer 90 are formed in sequence on the base substrate 10 on which the above structures are formed, and the source drain metal layer 90 is patterned, so as to form a plurality of sources 91 and a plurality of drains 92.

In some embodiments of the present disclosure, a patterning process refers to a process that may include a photolithography process, or may include a photolithography process and an etching process, or may also include printing, inkjet, and other processes for forming a predetermined pattern. The photolithography process refers to a process of forming a pattern by using a photoresist, a mask plate, an exposure machine, etc. that includes film formation, exposure, development, and other processes. A corresponding patterning process may be selected according to a formed structure in some embodiments of the present disclosure.

Herein, the single patterning process in embodiments of the present disclosure refers to a process of forming different exposure regions by a single mask exposure process, and then performing different etchings, ashing, and other removal processes on the different exposure regions, so as to finally obtain a predetermined pattern. A description is made in embodiments of the present disclosure by taking this single pattern process as an example.

It will be noted that, in a top-gate TFT, the source 91 and the drain 92 may be provided on a top layer (e.g., the interlayer dielectric layer 80) and coupled to a pattern of an active layer through through holes, as shown in FIG. 4, or may be provided on a bottom layer (e.g., the second buffer layer 40) and directly connected to the active layer 51, or may be coupled to the active layer in other ways. In embodiments of the present disclosure, whether the first TFTs A and the second TFTs B are top-gate TFTs or bottom-gate TFTs are not specifically limited.

In addition, the above TFTs may be amorphous silicon TFTs, polycrystalline silicon TFTs, oxide semiconductor TFTs, or organic TFTs. Oxide semiconductor TFTs have stable performance and good display effect. Therefore, in some embodiments of the present disclosure, a description is made by taking an example in which the TFTs are all oxide semiconductor TFTs.

The oxide semiconductor TFTs refers to TFTs with an active layer (i.e., semiconductor active layer) that is made of an oxide semiconductor material, and the oxide semiconductor material of the semiconductor active layer may include, for example, one or more of zinc oxide (ZnO), cadmium oxide (CdO), aluminum oxide ($Al_2O_3$), or indium gallium zinc oxide (IGZO). For oxide semiconductor TFTs, the oxygen content in the environment that is in contact with the active layer 51 will affect the electrical properties of the oxide semiconductor TFT to a certain extent.

In addition, in some embodiments of the present disclosure, all TFTs may be N-type transistors or P-type transistors, which is not limited by the embodiments of the present disclosure, but all should fall within the protection scope of the present disclosure.

In some embodiments of the present disclosure, as shown in FIG. 4, an orthographic projection of an active layer 51 of a first TFT A on the base substrate 10 is located within a range of an orthographic projection of an oxygen barrier portion 30 on the base substrate 10.

In this way, as shown in FIG. 4, the oxygen barrier portion 30 at least completely shields the active layer 51 of the first TFT A that is located directly above the oxygen barrier portion 30, thereby preventing oxygen atoms in the first buffer layer 20 having a high content of oxygen from diffusing into the first TFT A and affecting a low oxygen environment of the first TFT A.

In some embodiments of the present disclosure, a material constituting the oxygen barrier portion 30 is a light-shielding material that is opaque.

Since the oxygen barrier portion 30 is opaque, in a process of blocking the diffusion of oxygen atoms, the oxygen barrier portion 30 may also block light that enters from a side of the base substrate 10 at the same time, thereby avoiding an influence of light on the TFTs.

For example, an OLED display device is a self-luminous display device, and emits light through a cathode, an anode, and a light-emitting layer that are disposed in the array substrate under the excitation of an applied electric field, the light-emitting layer composed of an organic thin film layer and sandwiched between the cathode and the anode. Since the base substrate 10 is generally made of a light transmissive material, light entering from the side of the base substrate 10 directly incident on the oxide semiconductor layer (i.e., the active layer 51) of the TFT may affect the performance of the TFT. In particular, since driving TFTs in the OLED display device require high precision and stability, the influence of incident light may further cause display abnormalities. Therefore, an opaque oxygen barrier portion 30 may block the light entering from the side of the base substrate 10, and prevent the light from affecting the stable performance of the driving TFTs (e.g., the first TFTs A as shown in FIG. 3).

In addition, some embodiments of the present disclosure do not limit a material, the thickness, and the number of layers of the oxygen barrier portion 30, which can be set by those skilled in the art according to actual needs, as long as the purpose of blocking further diffusion of oxygen atoms by the oxygen barrier portion 30 and shielding light at a position of the oxygen barrier portion 30 is achieved.

For example, the oxygen barrier pattern 301 may be a layer of metal material pattern. For example, as shown in FIG. 2, the oxygen barrier portion 30 is made of a material such as molybdenum (Mo), aluminum (Al), or aluminum alloy having a thickness of 1000 angstroms.

Since a thickness of the single layer the oxygen barrier portion 30 is small, in order to increase a light-blocking effect of the oxygen barrier portion 30, in some embodiments of the present disclosure, it may be arranged that the oxygen barrier portion 30 includes at least two thin film layers.

Figure 5:
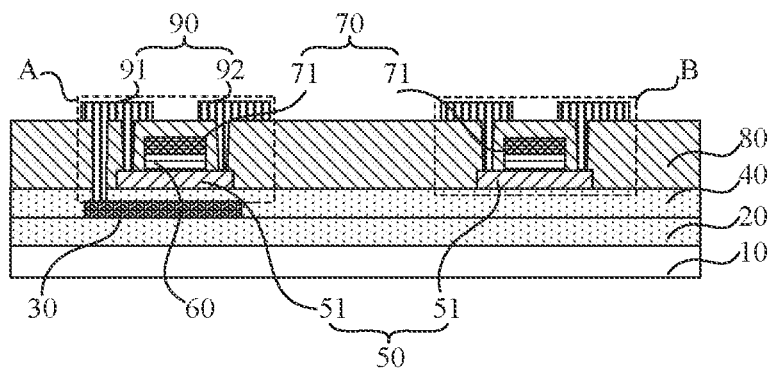
FIG. 5 is a schematic diagram showing a local structure of yet another array substrate, in accordance with some embodiments of the present disclosure.

In addition, as shown in FIG. 5, in a case where the oxygen barrier portion 30 is made of a metal material, a source 91 of a first TFT A is coupled to an oxygen barrier portion 30 through a through hole. In this way, in a case where an orthographic projection of an active layer 51 of a first TFT A on the base substrate 10 is within the range of an orthographic projection of an oxygen barrier portion 30 on the base substrate 10, since the oxygen barrier portion 30 has a large area, and edges of the oxygen barrier portion 30 may extend beyond edges of the source 91 or may overlap with the edges of the source 91. In this way, by setting the source 91 of the first TFT A is coupled to the oxygen barrier portion 30, a voltage Vs of the source 91 of the first TFT A at an end thereof away from the gate is equivalent or approximately equivalent to a voltage Vs of the source 91 of the first TFT A at an end thereof proximate to the gate. Thereby, a gate source voltage Vgs (i.e., a voltage difference between a gate and a source in the same TFT) of the first TFT A is even, and the purpose of improving the electrical properties of the first TFT A is achieved.

In addition, since the source 91 of the first TFT A is coupled to the oxygen barrier portion 30, it is possible to prevent the plurality of oxygen barrier portions 30 from becoming a plurality of island electrodes that may cause accumulated charges that cannot be released during a display process.

Figure 6:
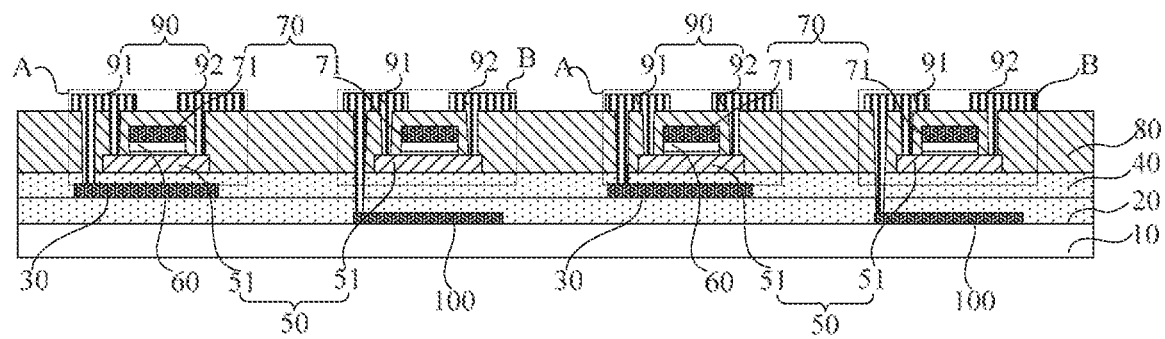
FIG. 6 is a schematic diagram showing a local structure of yet another array substrate, in accordance with some embodiments of the present disclosure.

In a case where the second TFTs B are top-gate TFTs, as shown in FIG. 6, the array substrate further includes a light-shielding pattern disposed between the base substrate 10 and the first buffer layer 20. The light-shielding pattern includes a plurality of light-shielding portions 100 that are insulated and spaced apart.

An orthographic projection of a portion of an active layer 51 of a second TFT B between a source 91 and a drain 92 on the base substrate 10 (i.e., a channel region formed after the second TFT B is turned on) is located within a range of an orthographic projection of one light-shielding portion of the plurality of light-shielding portions 100 on the base substrate 10. In this way, the light-shielding portion 100 may prevent the light entering from the side of the base substrate 10 from reaching the active layer 51 of the second TFT B.

In addition, in a case where a material constituting the light-shielding portion 100 is a conductive material, a source 91 of a second TFTs B is coupled to a light-shielding portion 100. In this way, it is possible to prevent the plurality of light-shielding portions 100 from becoming a plurality of island electrodes that may cause accumulated charges that cannot be released during the display process.

In some embodiments of the present disclosure, the array substrate is an array substrate in an OLED display device, the first TFTs A are driving TFTs, and the second TFTs B are switching TFTs.

In this way, by providing an oxygen barrier portion 30 between the first buffer layer 20 and the second buffer layer 40 under an orthographic projection of a first TFT A, it is possible to ensure that the second TFTs B are in a film layer environment with a high content of oxygen. In the meantime, due to a blocking effect of the oxygen barrier portion 30, it is possible to ensure that the first TFT A is in a film layer environment with a low content of oxygen, and provide a film layer environment with a required oxygen content for the driving TFTs and switching TFTs to achieve better performance.

Some embodiments of the present disclosure provide a display device, which includes any one of the array substrates described above. The display device has the same technical effects as those of the array substrates provided by the above embodiments, and details are not described herein again.

It will be noted that the display device may be a display panel or a display device including a display panel, such as a display, a television, a notebook computer, a digital photo frame, a mobile phone, a tablet computer, a navigator, or any other product or component having a display function. For example, the display device may be an OLED display device.

Figure 7:
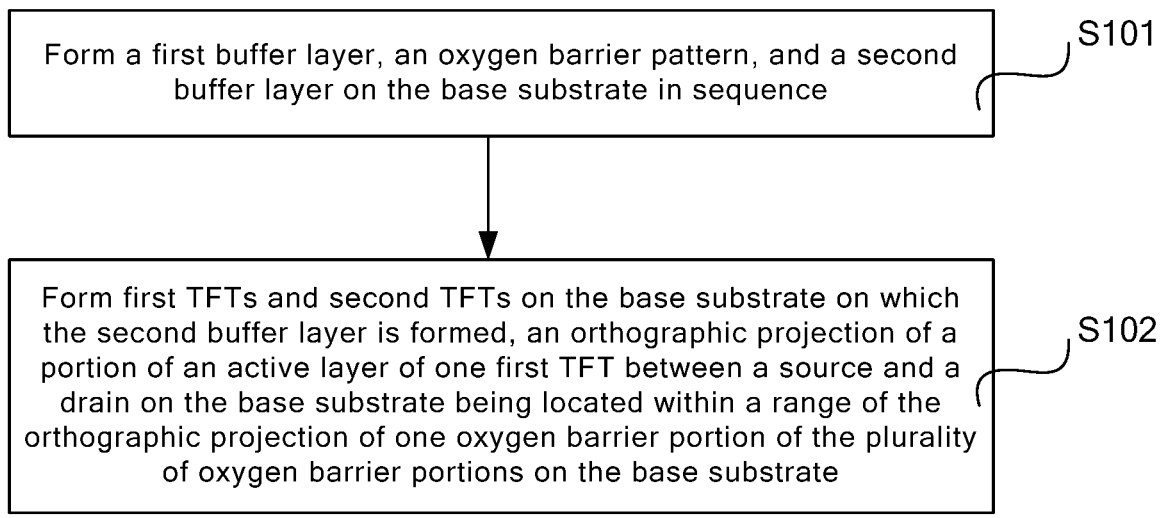
FIG. 7 is a flow chart of a method of manufacturing an array substrate, in accordance with some embodiments of the present disclosure.

Some embodiments of the present disclosure provide a method of manufacturing an array substrate. As shown in FIG. 7, the method includes step 101 (S101) and step 102 (S102).

In S101, a first buffer layer 20, an oxygen barrier pattern 301, and a second buffer layer 40 are formed on the base substrate 10 in sequence.

The oxygen content of the first buffer layer 20 is higher than the oxygen content of the second buffer layer 40. The oxygen barrier pattern 301 includes a plurality of oxygen barrier portions 30 that are insulated and spaced apart.

In S102, first TFTs A and second TFTs B are formed on the base substrate 10 on which the second buffer layer 40 is formed. An orthographic projection of an active layer 51 of one first TFT A between a source and a drain on the base substrate 10 is located within a range of an orthographic projection of one oxygen barrier portion 30 of the plurality of oxygen barrier portions 30 on the base substrate 10.

In this way, the oxygen barrier portion 30 may completely shield a channel region formed after the first TFT A is turned on. In a case where the oxygen content of the first buffer layer 20 is higher than the oxygen content of the second buffer layer 40, oxygen atoms in the first buffer layer 20 having a high content of oxygen will gradually diffuse into the second buffer layer 40 having a low content of oxygen. At a position corresponding to the first TFT A, due to a blocking effect of the oxygen barrier portion 30, the first TFT A may still be in a film layer environment with a low content of oxygen. Therefore, the purpose of providing film layer environments with different oxygen contents for the first TFT A and the second TFT B as needed is achieved, thereby ensuring better electrical properties of both the first TFT A and the second TFT B.

Some embodiments of the present disclosure do not specifically limit the oxygen content of the first buffer layer 20 and the oxygen content of the second buffer layer 40, which can be designed and implemented by those skilled in the art within a reasonable range according to actual needs.

Figure 8:
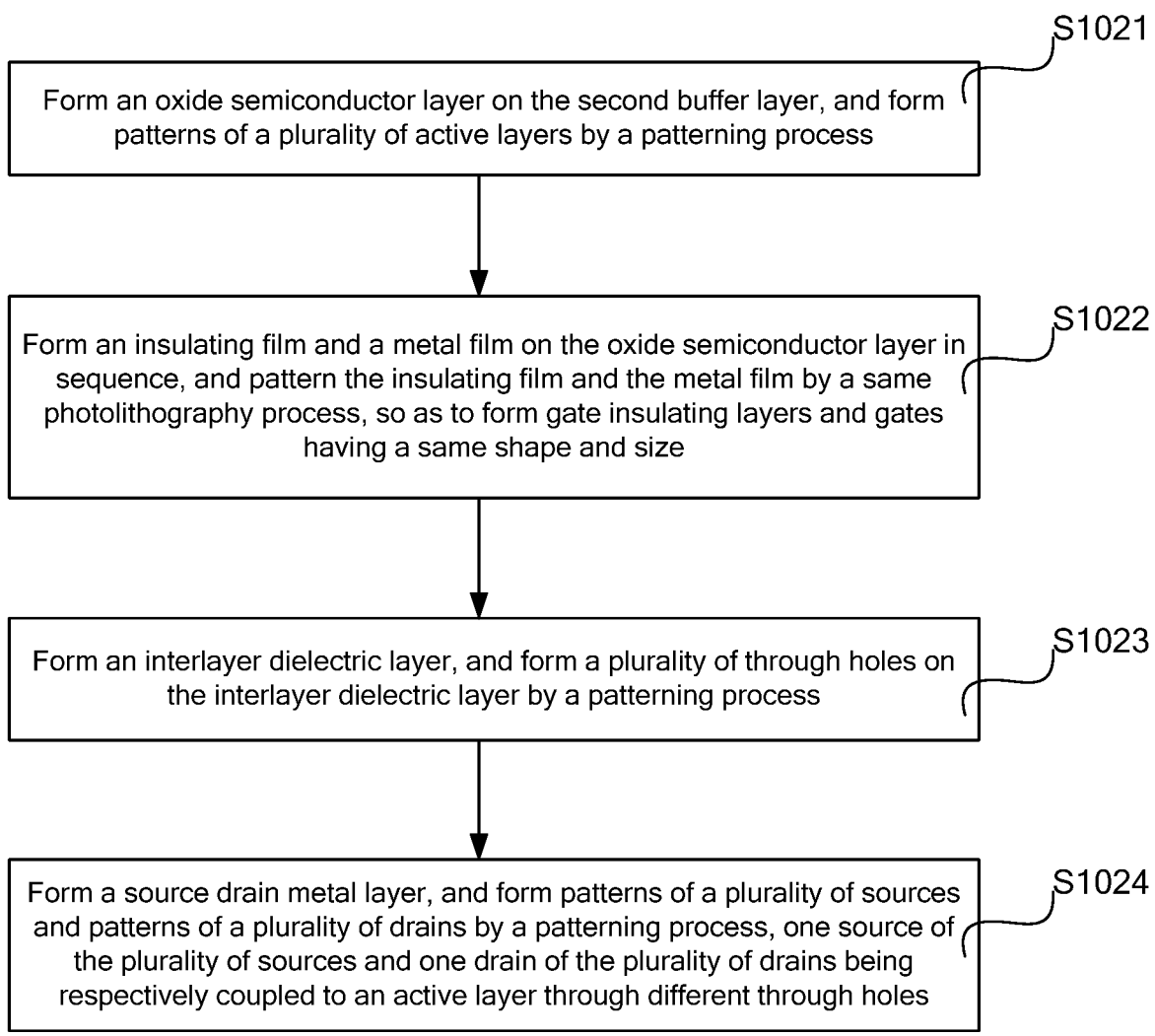
FIG. 8 is a flow chart of another method of manufacturing an array substrate, in accordance with some embodiments of the present disclosure.

In some embodiments of the present disclosure, as shown in FIG. 8, the step of forming first TFTs A and second TFTs B at the base substrate 10 on which the second buffer layer 40 is formed includes step 1021 to step 1024 (S1021 to S1024).

In S1021, an oxide semiconductor layer 50 is formed on the second buffer layer 40, and patterns of a plurality of active layers 51 are formed by a patterning process.

In S1022, an insulating film (i.e., a gate insulating layer 60 laid in a form of a whole layer) and a metal thin film (i.e., a gate metal layer 70 laid in a form of a whole layer) are formed on the patterns of a plurality of active layers 51 in sequence, and the insulating film and the metal film are patterned by a same photolithography process, so as to form small gate insulating layers 60 and gates 71 having a same shape and size.

In S1023, an interlayer dielectric layer 80 is formed, and a plurality of through holes are formed on the interlayer dielectric layer 80 by a patterning process.

In S1024, a source drain metal layer 90 is formed, and patterns of a plurality of sources 91 and patterns of a plurality of drains 92 are formed by a patterning process. One source 91 of the plurality of sources 91 and one drain 92 of the plurality of drains 92 are respectively coupled to an active layer 51 through different through holes, so as to obtain the first TFTs A and the second TFTs B.

Figure 9:
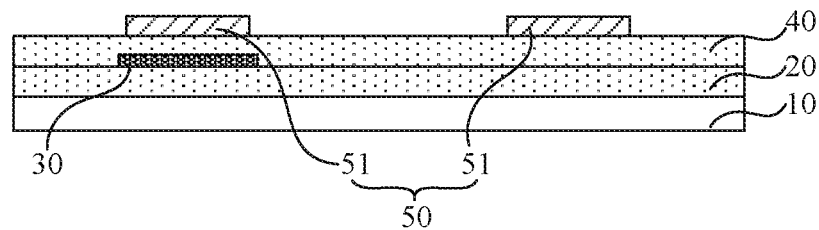
FIG. 9 is a schematic diagram showing a local structure of yet another array substrate, in accordance with some embodiments of the present disclosure.

For example, a process of forming the first TFTs A and the second TFTs B may be as follows: first, as shown in FIG. 9, an oxide semiconductor layer 50 is formed on the second buffer layer 40, and a patterning process is performed on the oxide semiconductor layer 50, so as to form a plurality of active layers 51. For example, the process may be as follows: a single patterning process including film formation, exposure, development, etc. is performed on the formed oxide semiconductor layer 50, so as to form active layers 51.

Figure 10:
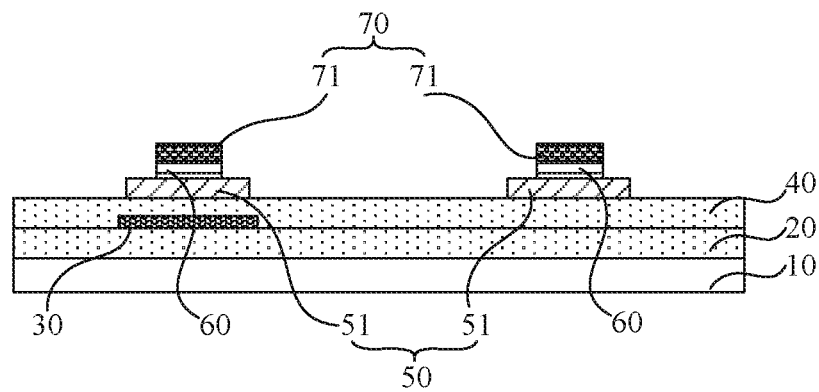
FIG. 10 is a schematic diagram showing a local structure of yet another array substrate, in accordance with some embodiments of the present disclosure.

Then, as shown in FIG. 10, an insulating film and a metal film are formed on the patterns of a plurality of active layers 51 in sequence, and the insulating film and the metal film are patterned to form a plurality of gate insulating layers 60 and a plurality of gates 71 having a same shape and size. The patterning process includes a single mask exposure process. That is, one of the plurality of gate insulating layers 60 and one corresponding gate 71 of the plurality of gates 71 are disposed on top of one another. In this way, a mask exposure process is saved, processes are reduced, and productivity is increased.

Figure 11:
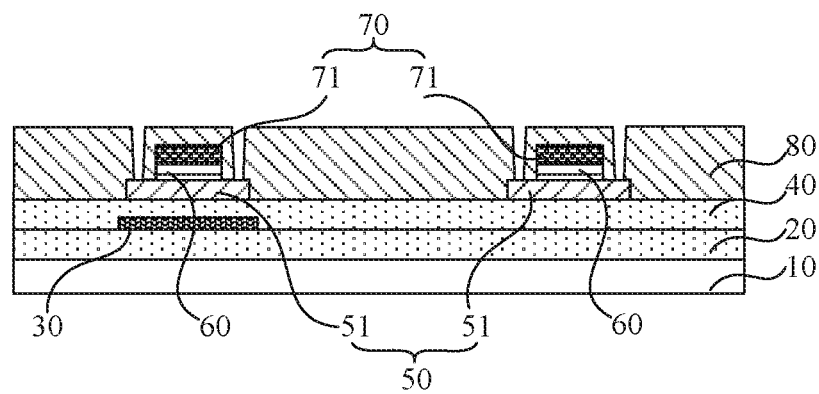
FIG. 11 is a schematic diagram showing a local structure of yet another array substrate, in accordance with some embodiments of the present disclosure.

Next, as shown in FIG. 11, an interlayer dielectric layer 80 is formed on the base substrate 10 on which the above structures are formed, and the interlayer dielectric layer 80 has through holes above the active layer 51.

Finally, a source drain metal layer 90 is formed, and the source drain metal layer 90 is patterned to form a plurality of sources 91 and a plurality of drains 92. A source 91 and a drain 92 are respectively coupled to an active layer 51 through through holes, so as to obtain the first TFTs A and second TFTs B as shown in FIG. 4.

The TFTs formed by the above methods are all top-gate TFTs. In the above description of the working principle and working process of the array substrate, the TFTs of the array substrate have been described in detail, and will not be described herein again.

In some embodiments of the present disclosure, after the oxide semiconductor layer 50 is formed on the second buffer layer 40, the method further includes performing an annealing or heating process. In this way, during the annealing or heating process, oxygen atoms in the first buffer layer 20 having a high content of oxygen may rapidly diffuse into the second buffer layer 40 and further into the active layer 51, so as to increase the oxygen content of the second TFTs B.

And/or, after forming the gate insulating layer 60 and the gate metal layer 70, the method further includes performing an annealing or heating process. In this way, a diffusion rate and a diffusion efficiency of the oxygen atoms may be improved.

And/or, after forming the first TFTs A and the second TFTs B, the method further includes performing an annealing or heating process. In this way, the annealing or heating process may be performed only once, or may be performed in all three processes of forming the first TFTs A and the second TFTs B (i.e., a process of forming gates of the above TFTs, a process of forming active layers of the above TFTs, and a process of forming sources and drains of the above TFTs), so as to further increase a diffusion rate and a diffusion effect of the oxygen atoms.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An array substrate, comprising a base substrate, a light-shielding pattern, a first buffer layer, an oxygen barrier pattern, and a second buffer layer that are disposed on the base substrate in sequence, and a plurality of first thin film transistors (TFTs) and a plurality of second TFTs that are disposed on the second buffer layer; wherein
the light-shielding pattern is located between the base substrate and the first buffer layer, and the light-shielding pattern includes a plurality of light-shielding portions that are insulated and spaced apart;

the oxygen barrier pattern includes a plurality of oxygen barrier portions that are insulated and spaced apart; wherein, an orthographic projection of a portion of an active layer of one first TFT between a source and a drain on the base substrate is located within a range of an orthographic projection of one corresponding oxygen barrier portion of the plurality of oxygen barrier portions on the base substrate and is outside a range of an orthographic projection of any one of the plurality of light-shielding portions on the base substrate;

an orthographic projection of a portion of an active layer of one second TFT between a source and a drain on the base substrate is located within a range of an orthographic projection of one corresponding light-shielding portion of the plurality of light-shielding portions on the base substrate and is outside a range of an orthographic projection of any one of the plurality of oxygen barrier portions on the base substrate;

an oxygen content of the first buffer layer is higher than an oxygen content of the second buffer layer; and the first TFTs are driving TFTs, and the second TFTs are switching TFTs.

2. The array substrate according to claim 1, wherein a material of the oxygen barrier portion includes a light-shielding material.

3. The array substrate according to claim 1, wherein the oxygen barrier pattern includes at least two thin films that are disposed on top of one another.

4. A display device, comprising the array substrate according to claim 1.

5. The array substrate according to claim 1, wherein a content of an oxygen source in the first buffer layer is higher than that in the second buffer layer, so that an oxygen content of the first buffer layer is higher than an oxygen content of the second buffer layer;

materials of the first buffer layer and the second buffer layer include silicon dioxide, and the oxygen source includes nitrous oxide.

6. The array substrate according to claim 1, wherein one second TFT is a top-gate TFT.

7. The array substrate according to claim 6, wherein a material of the light-shielding portion includes a conductive material; and a source of the second TFT is coupled to the light shielding portion.

8. The array substrate according to claim 7, further comprising an interlayer dielectric layer located between sources of the plurality of second TFTs and the second buffer layer, wherein a source of the second TFT is connected to the light-shielding portion through one through hole passed through the interlayer dielectric layer, the second buffer layer and the first buffer layer.

9. The array substrate according to claim 1, wherein an orthographic projection of the active layer of one first TFT on the base substrate is located within the range of the orthographic projection of one corresponding oxygen barrier portion of the plurality of oxygen barrier portions on the base substrate.

10. The array substrate according to claim 9, wherein one first TFT is a top-gate TFT.

11. The array substrate according to claim 9, wherein a material of the oxygen barrier portion includes a conductive material; and a source of the first TFT is coupled to the oxygen barrier portion.

12. The array substrate according to claim 11, further comprising an interlayer dielectric layer located between sources of the plurality of first TFTs and the second buffer layer, wherein a source of the first TFT is connected to the oxygen barrier portion through one through hole passed through the interlayer dielectric layer and the second buffer layer.

13. A method of manufacturing an array substrate, wherein the array substrate comprises:

a base substrate, a light-shielding pattern, a first buffer layer, an oxygen barrier pattern, and a second buffer layer that are disposed on the base substrate in sequence, and a plurality of first thin film transistors (TFTs) and a plurality of second TFTs that are disposed on the second buffer layer; wherein the light-shielding pattern is located between the base substrate and the first buffer layer, and the light-shielding-pattern includes a plurality of light-shielding-portions that are insulated and spaced apart;

the oxygen barrier pattern includes a plurality of oxygen barrier portions that are insulated and spaced apart; wherein, an orthographic projection of a portion of an active layer of one first TFT between a source and a drain on the base substrate is located within a range of an orthographic projection of one corresponding oxygen barrier portion of the plurality of oxygen barrier portions on the base substrate and is outside a range of an orthographic projection of any one of the plurality of light-shielding portions on the base substrate;

an orthographic projection of a portion of an active layer of one second TFT between a source and a drain on the base substrate is located within a range of an orthographic projection of one corresponding light-shielding portion of the plurality of light-shielding portions on the base substrate and is outside a range of an orthographic projection of any one of the plurality of oxygen barrier portions on the base substrate;

an oxygen content of the first buffer layer is higher than an oxygen content of the second buffer layer; and the first TFTs are driving TFTs, and the second TFTs are switching TFTs;

wherein the method comprises:

forming the light-shielding pattern, the first buffer layer, the oxygen barrier pattern, and the second buffer layer on the base substrate in sequence; and forming the plurality of first TFTs and the plurality of second TFTs at the base substrate on which the second buffer layer is formed.

14. The method for manufacturing the array substrate according to claim 13, wherein materials of the first buffer layer and the second buffer layer include silicon dioxide, and an oxygen source includes nitrous oxide;

forming the first buffer layer and the second buffer layer, includes:

adjusting a content of the oxygen source in the first buffer layer and the second buffer layer, so that the content of the oxygen in a process of forming the first buffer layer is greater than that in a process of forming the second buffer layer.

15. The method of manufacturing the array substrate according to claim 13, wherein forming the plurality of first TFTs and the plurality, of second TFTs at the base substrate on which the second buffer layer is formed, includes:

forming an oxide semiconductor layer on the second buffer layer, and forming patterns of a plurality of active layers by performing a patterning process on the oxide semiconductor layer;

forming an insulating film and a metal film on the patterns of a plurality of active layers in sequence, and patterning the insulating film and the metal film by a same photolithography process, so as to form a plurality of gate insulating layers and a plurality of gates with each gate insulating layer and each gate having a same shape and size;

forming an interlayer dielectric layer, and forming a plurality of through holes on the interlayer dielectric layer by a patterning process; and forming a source drain metal layer, and forming patterns of a plurality of sources and patterns of a plurality of drains by performing a patterning process on the source drain metal layer, one source of the plurality of sources and one drain of the plurality of drains being respectively coupled to one corresponding active layer through different through holes.

16. The method for manufacturing an array substrate according to claim 15, wherein after forming the oxide semiconductor layer on the second buffer layer, the method further comprises performing an annealing or heating process;

and/or, after forming the gate insulating layers and the gates, the method further comprises performing an annealing or heating process;

and/or, after forming the first TFTs and the second TFTs, the method further comprises performing an annealing or heating process.

17. The method for manufacturing the array substrate according to claim 16, wherein performing the annealing or heating process, includes:

performing an annealing or heating process on the first buffer layer.

* * * * *